(12) United States Patent
Lopes et al.

(10) Patent No.: US 12,186,945 B2
(45) Date of Patent: Jan. 7, 2025

(54) METHOD FOR MANUFACTURING AN OPTO-ELECTRONIC COMPONENT SUBSTRATE

(71) Applicants: CENTRE NATIONAL DE LA RECHERCHE SCIENTIFIQUE, Paris (FR); UNIVERSITE PAUL SABATIER TOULOUSE III, Toulouse Cedex 9 (FR)

(72) Inventors: Manuel Lopes, Venerque (FR); Benoit Schlegel, Villepinte (FR); David Buso, Labarthe sur Lèze (FR); Georges Zissis, Toulouse (FR)

(73) Assignees: CENTRE NATIONAL DE LA RECHERCHE SCIENTIFIQUE, Paris (FR); UNIVERSITE PAUL SABATIER TOULOUSE III, Toulouse (FR)

( * ) Notice: Subject to any disclaimer, the term of this patent is extended or adjusted under 35 U.S.C. 154(b) by 947 days.

(21) Appl. No.: 17/275,336

(22) PCT Filed: Sep. 11, 2019

(86) PCT No.: PCT/EP2019/074189
§ 371 (c)(1),
(2) Date: Mar. 11, 2021

(87) PCT Pub. No.: WO2020/053253
PCT Pub. Date: Mar. 19, 2020

(65) Prior Publication Data
US 2022/0052279 A1    Feb. 17, 2022

(30) Foreign Application Priority Data

Sep. 11, 2018 (FR) .................... 18 58138

(51) Int. Cl.
*B29C 43/24* (2006.01)
*B29C 43/02* (2006.01)
(Continued)

(52) U.S. Cl.
CPC ............ *B29C 43/24* (2013.01); *B29C 43/021* (2013.01); *B29C 59/005* (2013.01);
(Continued)

(58) Field of Classification Search
CPC .................... B29C 43/24; B29C 2043/5825
See application file for complete search history.

(56) References Cited

U.S. PATENT DOCUMENTS 9,490,454 B2 * 11/2016 Pei ........................ H10K 50/135
2004/0164674 A1 * 8/2004 Ottermann ............. H10K 50/80
                                                          313/506
(Continued)

OTHER PUBLICATIONS

Brondijk, J., et al. "Roughness and deformation aspects in calendering of particulate magnetic tape." IEEE Transactions on Magnetics 23.1 (Jan. 1987): 146-149. (Year: 1987).*

(Continued)

*Primary Examiner* — Benjamin A Schiffman
(74) *Attorney, Agent, or Firm* — WC&F IP

(57) ABSTRACT

The invention relates to a method for manufacturing an optoelectronic component substrate (12) comprising a stack of layers, the method comprising a step of:
preforming a substrate (12) comprising a face which has a pattern with at least one zone made of a first material and one zone made of a second material, the two materials being thermosetting or thermoplastic materials, the first material being an electrically conductive material and the second material being an electrically insulating material, and
(Continued)

molding by compression the face of the substrate (12) with a face of a reference element (22) having a surface roughness less than or equal to 50 nanometers.

6 Claims, 1 Drawing Sheet

(51) Int. Cl.
*B29C 59/00* (2006.01)
*B29C 59/02* (2006.01)
*H10K 77/10* (2023.01)
*B29L 31/34* (2006.01)
*H10K 71/00* (2023.01)

(52) U.S. Cl.
CPC .... *B29C 59/026* (2013.01); *B29K 2995/0005* (2013.01); *B29K 2995/0007* (2013.01); *B29L 2031/3406* (2013.01); *H10K 71/821* (2023.02); *H10K 77/10* (2023.02)

(56) References Cited

U.S. PATENT DOCUMENTS

| | | | | |
|---|---|---|---|---|
| 2011/0018424 | A1* | 1/2011 | Takada | H10K 50/81 313/352 |
| 2011/0100440 | A1* | 5/2011 | Schmidt | H01L 31/1085 136/255 |
| 2014/0267107 | A1 | 9/2014 | Gaynor | |
| 2017/0229668 | A1* | 8/2017 | Stapleton | H10K 71/60 |

OTHER PUBLICATIONS

Lochun, D., et al. "Post-processing of conductive lithographic films for multilayer device fabrication." Twenty Fourth IEEE/CPMT International Electronics Manufacturing Technology Symposium (Cat. No. 99CH36330). IEEE, Oct. 19, 1999. (Year: 1999).*

Lochun, Darren, et al. "Manufacturing flexible light-emitting polymer displays with conductive lithographic film technology." Smart materials and structures 10.4 (Jul. 18, 2001): 650. (Year: 2001).*

Shaheen, Sean E., et al. "Fabrication of bulk heterojunction plastic solar cells by screen printing." Applied Physics Letters 79.18 (Oct. 29, 2001): 2996-2998. (Year: 2001).*

Korhonen, Raimo. "Future opportunities in production of disposable optics and electronics." Functional Integration of Opto-Electro-Mechanical Devices and Systems. vol. 4284. SPIE, 2001. (Year: 2001).*

Lee, Hyemi, et al. "Nanoscale thickness and roughness control of gravure printed organic light emitting layer with poly (N-vinyl carbazole) and Ir (ppy) 3." Journal of Nanoscience and Nanotechnology 9.12 (Dec. 1, 2009): 7278-7282. (Year: 2009).*

Eom, Seung Hun, et al. "Polymer solar cells based on inkjet-printed PEDOT: PSS layer." Organic Electronics 10.3 (Feb. 10, 2009): 536-542. (Year: 2009).*

Zhu, Hongli, et al. "Transparent paper: fabrications, properties, and device applications." Energy & Environmental Science 7.1 (Nov. 11, 2013): 269-287. (Year: 2013).*

Kronfli, Rosanna. A Novel Design for Fully Printed Flexible AC-Driven Powder Electroluminescent Devices on Paper. Diss. University of Toronto, 2014. (Year: 2014).*

Lee, Sang Hoon, et al. "Application of calendering for improving the electrical characteristics of a printed top-gate, bottom-contact organic thin film transistors." Japanese Journal of Applied Physics 57.5S (Mar. 26, 2018): 05GC01. (Year: 2018).*

Shanmugam, Kirubanandan, et al. "Engineering surface roughness of nanocellulose film via spraying to produce smooth substrates." Colloids and Surfaces A: Physicochemical and Engineering Aspects 589 (Dec. 27, 2019): 124396. (Year: 2019).*

Bharathan et al: "Polymer electroluminescent devices processed by inkjet printing: I. Polymer light-emitting logo", Applied Physics Letters, vol. 72, No. 21, pp. 2660-2662, May 25, 1998.

* cited by examiner

METHOD FOR MANUFACTURING AN OPTO-ELECTRONIC COMPONENT SUBSTRATE

FIELD OF THE INVENTION

The present invention relates to a method for manufacturing an optoelectronic component substrate. The invention also relates to a method for manufacturing an optoelectronic component. The invention also relates to an optoelectronic component substrate obtainable by the above-mentioned method. The invention also relates to an optoelectronic component, a related assembly and manufacturing apparatus.

BACKGROUND

The protection of the environment and the management of natural resources have become concerns of primary importance at the national and international level. Among the various energy-intensive technology areas is electric lighting, which represents approximately 19% of the world's total electricity production. Such consumption of electrical energy is accompanied by the emission of approximately 1,900 million tons of greenhouse gases.

As a result, alternative technologies are being developed, including OLED (Organic Light-Emitting Diode) technology. Such a technology allows indeed to obtain a good quality of lighting as well as a low power consumption.

It is known to manufacture organic light-emitting diodes by depositing different layers on a substrate.

SUMMARY

It is desirable that such a substrate has very precise surface qualities. In particular, a maximum roughness of 50 nanometers (nm) is recommended. Preferably, a maximum roughness of 20 nanometers (nm) is desired.

For this purpose, vacuum deposition techniques that are relatively complex to implement are often used. The complexity results in particular from the fact that a vacuum facility is required as well as the means to grow the various layers constituting the substrate.

There is therefore a need for a simpler method for manufacturing a substrate for an optoelectronic component.

For this purpose, the present description proposes a method for manufacturing an optoelectronic component substrate comprising a stack of layers, the method comprising a step of preforming a substrate having a patterned face with at least one area of a first material and one area of a second material, the two materials being thermosetting or thermoplastic polymeric materials, the first material being an electrically conductive material and the second material being an electrically insulating material, and a step of compression molding the substrate face with a face of a reference element having a surface roughness less than or equal to 50 nanometers.

According to particular embodiments, the manufacturing method includes one or more of the following features when technically possible:
- the face of the reference element has a surface roughness less than or equal to 20 nanometers.
- the first material is identical to the second material.
- an additive manufacturing technique is used in the preforming stage.

This description also covers a manufacturing method for an optoelectronic component, such as an organic light-emitting diode or an organic photovoltaic cell, including the steps of the substrate manufacturing method, the method being as previously described.

This description also relates to a substrate that can be obtained by the manufacturing method as previously described.

Also described is an optoelectronic component, such as an organic light-emitting diode or an organic photovoltaic cell, comprising a substrate as previously described.

The present description also includes an assembly, especially a display panel or light source, comprising a plurality of optoelectronic components as previously described.

This description also relates to an apparatus for manufacturing an optoelectronic component substrate comprising a stack of layers, the fabrication apparatus comprising a substrate pre-forming unit comprising a patterned face with at least one area of a first material and one area of a second material, both materials being thermosetting or thermoplastic materials, the first material being an electrically conductive material and the second material being an electrically insulating material, and the manufacturing apparatus comprising a unit for compression molding the substrate face with a face of a reference element presenting a surface roughness of 50 nanometers or less.

DESCRIPTION OF THE DRAWINGS

Other features and advantages of the invention will appear when reading the description which follows the embodiment of the invention, given as an example only with reference to the drawings which are.

DETAILED DESCRIPTION

Figure 1:
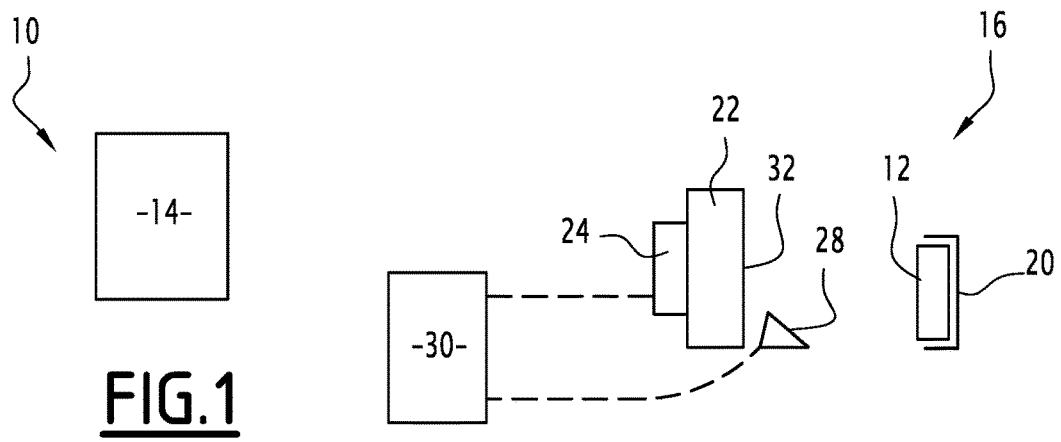
FIG. 1, a schematic representation of a manufacturing apparatus.

An apparatus for manufacturing an optoelectronic component substrate 10 is shown schematically in FIG. 1.

In the following, the apparatus 10 for manufacturing an optoelectronic component substrate 10 is more simply referred to as a fabrication apparatus 10.

The fabrication apparatus 10 is intended to fabricate a substrate 12.

A substrate is a support that serves as a base for other layers.

In this case, the stack of layers is intended to form an optoelectronic component.

An optoelectronic component is a component belonging to optoelectronics which is at the same time a branch of electronics and photonics. More precisely, an optoelectronic component is a component that emits or interacts with light. Examples include solar sensors or light-emitting diodes.

In this case, the fabrication apparatus 10 is preferably designed to fabricate substrates for optoelectronic components structured in thin layers.

The fabrication apparatus 10 consists of a preforming unit 14 and a compression molding unit 16.

The preforming unit 14 is suitable for implementing a preforming step 12 of the substrate.

The preforming unit 14 is, for example, a three-dimensional printer for forming the substrate 12 by adding material.

Figure 2:
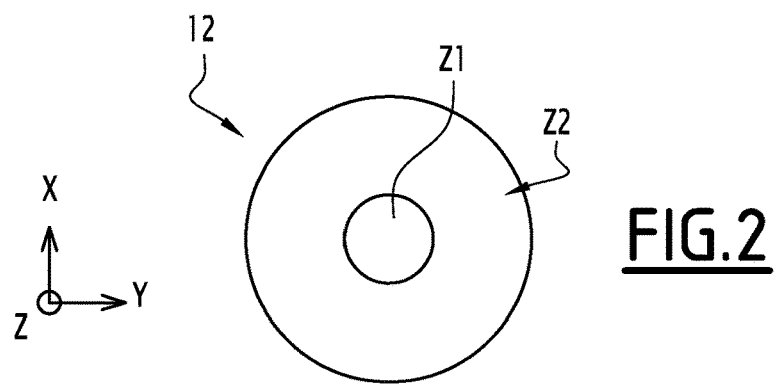
FIG. 2, a manufacturing substrate obtained at the end of the implementation of an example of a substrate pre-forming step.
Figure 3:
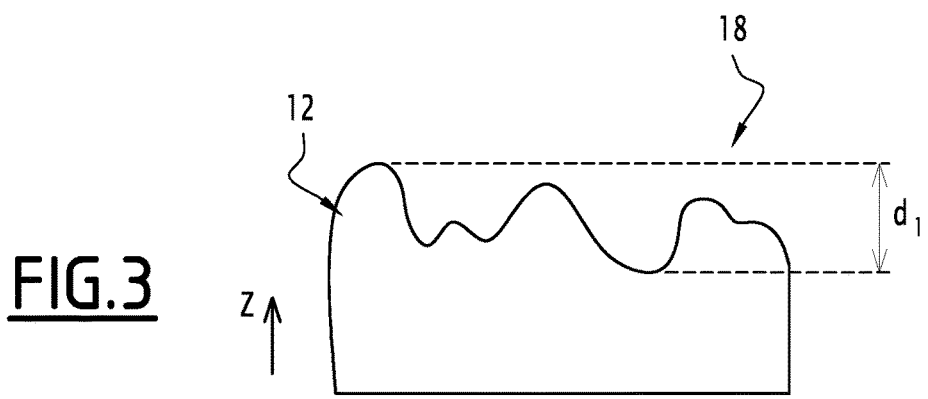
FIG. 3, a side view of the substrate in FIG. 2.

An example of the substrate 12 obtained at the end of the pre-forming step is shown in FIGS. 2 and 3.

The substrate 12 formed by the pre-forming unit 14 presents one face 18. Note that at this stage, the substrate 12 is also referred to as "the pre-formed".

The face 18 is the face intended to accommodate a stack of layers to form the optoelectronic component.

Therefore, the face 18 is referred to as support face 18 in the following.

Since the support face 18 is planar, a stacking direction Z is defined corresponding to the direction perpendicular to the support face 18. A first transverse direction is also defined, shown as an X axis in FIG. 2, and a second transverse direction perpendicular to the stacking direction Z and to the first transverse direction X. The second transverse direction is shown as a Y-axis in FIG. 2.

Alternatively, the support face 18 of the substrate 12 can be non-planar, especially concave or convex.

The support face 18 presents a first surface roughness noted $R_1$.

In general, the surface roughness R is a feature of the state of a surface. The roughness characterizes the geometrical defects of a surface.

The surface roughness R is, for example, measured by a profilometer.

In the proposed case, the first surface roughness $R_1$ is the maximum roughness of the support face 18, i.e., the distance between the highest point of the support face 18 and the lowest point of the support face 18, the distance being measured along the stacking direction Z. The corresponding distance is a first distance $d_1$, shown in FIG. 3.

Alternatively, the first surface roughness $R_1$ is the mean roughness of the support face, the mean roughness being the arithmetic mean of the heights at each point of the support face.

In the example shown, the first surface roughness $R_1$ of the support face 18 is greater than or equal to 50 nanometers (nm).

For example, the first surface roughness $R_1$ is greater than a few microns.

Therefore, the preforming step that the preforming unit 14 is able to implement can be qualified as rough because it allows to obtain a substrate 12 presenting a support face 18 unsuitable to be used to form an optoelectronic component.

According to the example described the substrate 12 presents a thickness along the stacking direction Z of 2.5 millimeters (mm) and the support face presents dimensions in the plane defined by the transverse directions X and Y of between 1 centimeter (cm) and 10 cm.

Other dimensions according to the X and Y transverse directions and according to the Z stacking direction are, of course, possible, since the fabrication apparatus 10 is compatible with many substrate 12 dimensions.

The support face 18 presents a pattern with a zone of a first material M1 and a zone of a second material M2.

According to the example in FIG. 2, the second material zone M2 completely surrounds the first material zone M1.

In addition, the substrate 12 has a round shape.

However, other shapes are possible such as square or hexagon shapes.

In addition, it should be noted that in the example shown in FIG. 2, the pattern is a doughnut.

Other patterns are possible.

In particular, the pattern consists of a set of zones of first material M1 dispersed in a precise pattern in the middle of a support of second material M2. The zones of the first material M1 are spatially arranged to ensure a good homogeneity of the electric current density over the entire surface of the substrate 12.

The first material M1 is an electrically conductive material.

The first material M1 is a thermoplastic material.

The first material M1 is, for example, PLA. PLA stands for PolyLactic Acid, which means polylactic acid. Polylactic acid is a fully degradable polymer that is often used to make commercial products, especially in the food industry.

Alternatively, the first material M1 is Acrylonitrile Butadiene Styrene, also known as ABS. More generally, the first material M1 according to this variant is a styrenic polymer.

According to another variant, the first material M1 is a thermosetting material such as, for example, an epoxy resin.

It should be noted that in such a case, the preforming and compression molding steps are carried out simultaneously.

Preferably, the first material M1 is transparent if this is favorable for the intended application of the substrate 12.

The second material M2 is also a thermoplastic material.

The second material M2, in contrast to the first material M1, is an electrical insulator.

The same examples as in the previous case can be applied to the second material M2, especially such as in the case of the PLA or ABS.

Preferably, the first material M1 and the second material M2 are identical to facilitate the fabrication of the substrate at the preforming stage. This is also advantageous for the compression molding step described in the following.

By "identical materials" in this context, it is understood that the first material M1 and the second material M2 are formed from the same material and differ only in the presence of elements that make one conductive or the other insulating. For example, silver is introduced into an insulating material to obtain the first material M1, the insulating material without silver being the second material M2. Other elements can be considered such as carbon-based structures, for example, graphite, fullerenes, carbon nanotubes and graphene.

When the first material M1 and the second material M2 are different, as demarcation zones between the two zones should be avoided during the compression molding step, the materials M1 and M2 preferably present similar behavior with temperature, especially in terms of viscosity.

The compression molding unit 16, referred to simply as molding unit 16 in the following, consists of a support 20, a reference element 22, a pressure applicator 24, a heating element 28 and a controller 30.

The molding unit 16 is suitable for implementing a hot-pressing step of the substrate 12 obtained from the preforming step that the preforming unit 14 is able to implement.

Compression molding is also known as hot pressing.

The support 20 holds the substrate 12 in position.

The reference element 22 is intended to be applied to the substrate 12.

In the case of FIG. 1, the reference element 22 is in the form of a spacer.

The reference element 22 comprises an application face 32. The application face 32 is the surface that comes into contact with the substrate 12 when the reference element 22 is applied to the substrate 12.

The application face 32 presents a reference surface roughness noted $R_{REF}$.

In this case, the reference surface roughness $R_{REF}$ is less than 50 nm.

Preferably, the reference surface roughness $R_{REF}$ is less than 20 nm.

Since the reference surface roughness $R_{REF}$ is the desired surface roughness for the substrate 12, the reference qualifier is used to qualify the element.

The reference element 22 is, for example, made of silicon wafer.

Alternatively, the reference element 22 is a glass wafer.

More generally, the reference element 22 is made of a hard material whose surface has been prepared to have a desired surface roughness of less than 20 nm by polishing, for example.

The pressure applicator 24 is suitable for applying pressure to the reference element 22 so that the substrate 12 is pressed between the reference element 22 on the one hand and a part of the support 20 on the other.

The assembly of the support 20 and the pressure applicator 24 forms a mold.

The term "press" sometimes refers to such a mold, especially when the technique is called hot pressing.

The heating element 28 is suitable for applying temperature variations to the reference element 22 and the support 20; this temperature profile will depend essentially on the material(s) used for the substrate 12.

The controller 30 is capable of controlling at least some elements of the molding unit 16, including the heating element 28 and pressure applicator 24.

The operation of the apparatus 10 is now described with reference to an example of how to implement a manufacturing method for the optoelectronic component substrate.

The manufacturing method consists of a pre-forming step and a compression molding step.

During the pre-forming step, the substrate 12 is formed as shown in FIGS. 2 and 3.

According to the proposed example, the pre-forming step is implemented by three-dimensional printing.

Three-dimensional printing refers to methods for manufacturing volume parts by adding or agglomerating material. In common usage, three-dimensional printing is often referred to as additive manufacturing. Additive manufacturing is defined as a method of shaping a part by adding material, by stacking successive layers as opposed to a method that removes material such as machining.

In this case, selective laser melting, selective laser sintering or fused wire deposition can be used.

Preferably, the least difficult technique will be chosen depending on the material used for the substrate 12.

In another embodiment, a multi-injection technique corresponding to the pre-forming and compression molding step is used.

Multi-material injection consists of injecting several different and compatible thermoplastic or thermosetting materials in the same tool and in the same mold. The same part can therefore be made of several materials.

In a multi-material injection technique, the final shaping of the materials M1 and M2 takes place simultaneously.

At the end of the preforming step, in the example described a substrate 12 for optoelectronic components is thus obtained, comprising a pattern with one or more zones made of the first material M1 and one zone made of the second material M2. In addition, this substrate 12 presents a support face 18 with a first surface roughness $R_1$ strictly greater than 50 nm.

During the molding step, the substrate 12 is heated to a temperature greater than the melting temperatures of the first material M1 and the second material M2 using the heating element 28.

Simultaneously, the pressure applicator 24 presses the reference element 22 so that the application face 32 is pressed against the support face 18 of the substrate 12 with a predefined pressure. Thus, the support surface 18 is compressed together with the application face 32.

The pressure applied depends, among other things, on the temperature to which the substrate 12 is heated and on the materials M1 and M2 under consideration.

According to the example described, the preset pressure is between 1 bar and 5 bar.

The preset pressure is applied for a period of less than 10 minutes.

During the molding step, with the support face 18 of the substrate 12 heated above their melting temperature, the first material M1 and the second material M2 have a low enough viscosity to be easily deformable and are therefore very compliant. The application of the application face 32 to the support face 18 of the substrate 12 then results in a transfer of the surface roughness of the application face 32 (the $R_{REF}$ reference surface roughness) to the support face 18 of the substrate 12. In this case, the application face 32 of the reference element 20 presents a surface roughness less than or equal to fifty nanometers, and the resulting substrate 12 presents a second surface roughness $R_2$ less than or equal to 50 nm.

In the case where the application face 32 of the reference element 20 presents a surface roughness less than or equal to 20 nm, the resulting substrate 12 presents a second surface roughness $R_2$ less than or equal to 20 nm.

Figure 4:
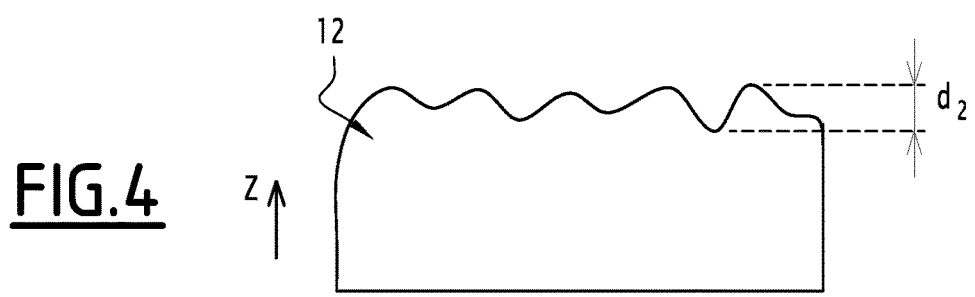
FIG. 4, a side view of the substrate as obtained after applying a second compression molding step of one reference face to the substrate in FIG. 2.

As before, the second surface roughness $R_2$ is the maximum surface roughness of the support face 18, i.e., the distance between the highest point of the support face 18 and the lowest point of the support face 18, the distance being measured along the stacking direction Z. The corresponding distance is a second distance $d_2$ and is shown in FIG. 4. The second distance $d_2$ is much smaller than the first distance $d_1$.

Thus, a substrate 12 presenting electrically conductive areas and good surface properties has been obtained with a low-cost and easily industrializable manufacturing method.

Indeed, the substrate 12 allows the establishment of two electrical contacts because the two zones Z1 and Z2 present different electrical properties and are accessible on both sides of the substrate 12. Such a substrate 12 is a through-contact substrate.

In addition, compression molding provides very good surface quality in terms of surface roughness.

It should be noted that this choice of step is the result of a real research work by the inventors.

In particular, a plurality of techniques have been tested, including the use of molding, the use of laser cutting or the use of a micro-milling machine. No combination tested by the plaintiff has so far produced satisfactory results.

The manufacturing method also presents the advantage that the reference element 22 can be used a plurality of times.

Because of these properties, such a substrate 12 is compatible with the realization of any optoelectronic component.

In particular, the fact that the substrate 12 is a through electrical contact substrate implies that the surface of the substrate is 100% usable since no area needs to be reserved for electrical contact lines.

Thus, the substrate 12 can advantageously be used to manufacture an organic light-emitting diode or an organic photovoltaic cell.

To illustrate such a possibility, a method for manufacturing an organic light-emitting diode from scratch is described.

The method for manufacturing an organic light-emitting diode first involves the same steps as the substrate fabrication method previously described to obtain the substrate 12.

Once the substrate 12 is made, the various layers constituting the organic light-emitting diode are deposited.

It is then necessary to distinguish two cases, namely a first emission pattern from the bottom (through the substrate) and a second emission pattern from the top. The first configuration is also called "back-emitting" while the second configuration is called "top-emitting".

In the case of the first configuration, the anode is deposited on the substrate 12 using a cathode sputtering technique.

The anode is, for example, made of an indium tin oxide, also called ITO.

Alternatively, the anode is made of AZO material, corresponding to a layer of aluminum-doped zinc oxide (ZnO).

Various layers of organic semiconductor materials are then deposited. The different deposited organic layers that will constitute the architecture of the organic light-emitting diode can vary in number and function, for example, a two-layer structure can be used with N,N'-Di(1-naphthyl)-N,N'-diphenyl-(1,1'-biphenyl)-4,4'-diamine also referred to by the formula NPB, as a hole transporter and the use of tris(8-hydroxyquinoline)aluminum(III), generally referred to as $Alq_3$, as materials for the dual function light emitting and electron transporting layer.

According to one example, layers of organic semiconductor materials are deposited by a dry process technique.

As an example, thermal evaporation or a cathode sputtering technique allow such deposition.

In the case of thermal evaporation, an evaporation system is used, equipped with a chamber in which a source and the deposition target are placed, as well as a vacuum pump and an energy source for evaporation. In the case of thermal evaporation, the material to be deposited is placed in a crucible which is heated by an electric current.

Cathode sputtering is a thin-film deposition technique. This technique allows the deposition of materials from a solid source, also called a target, which is subjected to a plasma. Within this plasma, an ion bombardment will pull atoms from the target and thus from the chosen material which will be deposited on a defined substrate.

According to another variant, the deposition of layers of organic semiconductor materials is implemented using a wet process technique.

Centrifugal coating is an example of a wet deposition technique.

Centrifugal coating is better known as "spin coating". Spin coating is a technique for depositing thin, uniform layers on the flat surface of a substrate.

Finally, the cathode is deposited to obtain the organic light-emitting diode in the first configuration called "back-emitting".

Using a high-temperature evaporation source, an aluminum deposit is laid on the entire surface shown by the organic layer deposition as well as on the side of the substrate in order to be in electrical contact.

Alternatively, calcium, magnesium or silver layers are deposited.

In contrast, in the case of the second configuration, the manufacturing method is essentially the same except that the order of deposition is reversed, the cathode being located below the organic emission zones and thus directly deposited on the surface of the substrate 12.

Thus, the result obtained is an organic light-emitting diode whose operation is now explained.

In operation, such a light-emitting diode functions as follows. When a potential difference is applied between the anode and the cathode, an electric field is formed, which results in a current flowing through the different layers of organic semiconductor materials constituting the diode. Thus, the cathode provides negative charges, i.e., electrons while the anode provides holes, i.e., positive charges. The two charge carriers move by jumping from molecule to molecule through the layers of organic materials until they meet in a recombination zone.

When this meeting takes place, an exciton is formed and is then de-excited. It is the de-excitation of the exciton that creates the radiation.

This fluorescence mechanism is the basic mechanism of light emission in organic light-emitting diodes. In addition, it should also be noted that the wavelength of the light emitted by organic light-emitting diodes is proportional to the difference in energy levels involved in the de-excitation of the exciton.

In a known way, the manufacturing method for the organic light-emitting diode may also include other steps such as an encapsulation step.

In conclusion, it should be noted that the substrate 12 thus obtained generally allows the deposition of organic electronic components in layers of a few tens of nanometers. Such a substrate 12 allows a 100% use of its surface.

For example, in the illustrated case of the deposition of an organic light-emitting diode, it is possible to have a surface that is entirely light-emitting. Thus, a lighting surface is obtained that could be similar to a macropixel with a front side that is an emitting surface. Such a macropixel can be described as an organic electroluminescent macropixel.

By assembly, the macropixel will make it possible to create sets of macropixels, the sets corresponding to lighting sources or large display panels without the additional production costs that are inherent to the increase in the size of the lighting zone in current organic technologies.

By large dimension, in this context, it is understood that at least one of the dimensions of the panel is greater than or equal to thirty centimeters.

This type of assembly is advantageously used in the transportation environment for mobile vehicles such as trains or airplanes. An example of such an assembly is an aircraft interior lighting device or a display device on the exterior of an aircraft.

The invention relates to any technically possible combination of the above-described embodiments.

The invention claimed is:

1. A method for manufacturing a substrate of an optoelectronic component comprising a stack of layers, the method comprising a step of:

preforming a substrate comprising a face having a pattern with at least one zone made of a first material and a zone made of a second material, wherein the first material and the second material each are thermosetting or thermoplastic materials, wherein the first material is an electrically conductive material and the second material is an electrically insulating material, wherein the face of the substrate is planar, and wherein the zone made of the second material completely surrounds the at least one zone made of the first material, and molding by compression the face of the substrate with a face of a reference element presenting a surface roughness less than or equal to 50 nanometers.

2. The method according to claim 1, wherein the face of the reference element has a surface roughness of less than or equal to 20 nanometers.

3. The method according to claim 1, wherein the first material and the second material are formed from the same material.

4. The method according to claim 1, wherein an additive manufacturing technique is used in the preforming step.

5. A method for manufacturing an optoelectronic component, comprising the steps of
 manufacturing a substrate according to the method of claim 1, and
 assembling the optoelectronic component to include the substrate.

6. The method of claim 5, wherein the optoelectronic component is an organic light-emitting diode or an organic photovoltaic cell.

* * * * *